United States Patent [19]

Havas et al.

[11] 4,202,914
[45] May 13, 1980

[54] METHOD OF DEPOSITING THIN FILMS OF SMALL DIMENSIONS UTILIZING SILICON NITRIDE LIFT-OFF MASK

[75] Inventors: Janos Havas, Hopewell Junction; Gabor Paal, Fishkill, both of N.Y.

[73] Assignee: International Business Machines Corporation, Armonk, N.Y.

[21] Appl. No.: 974,461

[22] Filed: Dec. 29, 1978

[51] Int. Cl.$^2$ .............................................. B05D 3/06
[52] U.S. Cl. ..................................... 427/38; 156/655; 156/661.1; 156/643; 427/43.1; 430/313; 430/319
[58] Field of Search ........................... 427/38, 39, 43; 96/36.2; 156/643, 650, 655, 661

[56] References Cited
U.S. PATENT DOCUMENTS

| | | | |
|---|---|---|---|
| 3,849,136 | 11/1974 | Grebe | 96/36.2 |
| 3,864,180 | 2/1975 | Barraclough | 96/36.2 |
| 3,873,361 | 3/1975 | Franco et al. | 96/36 |
| 3,982,943 | 9/1976 | Feng et al. | 96/38.4 |
| 3,985,597 | 12/1976 | Zielinski | 427/90 |
| 4,004,044 | 1/1977 | Franco et al. | 427/43 |
| 4,076,575 | 2/1978 | Chang | 156/643 |
| 4,097,889 | 6/1978 | Kern et al. | 427/94 |

Primary Examiner—John H. Newsome
Attorney, Agent, or Firm—Sughrue, Rothwell, Mion, Zinn and Macpeak

[57] ABSTRACT

A method for depositing thin film patterns of very small and controllable dimensions in the fabrication of integrated circuits which avoids edge tearing of the films. A non-photosensitive organic polymeric first masking layer is deposited on the integrated circuit substrate. Upon this layer is deposited a layer of silicon nitride using plasma deposition techniques employing a gaseous source. The silicon nitride layer is covered by a second masking layer, preferably an organic polymeric resist material, through which apertures are formed in preselected patterns using standard lithographic masking and etching techniques. The silicon nitride layer is then reactive ion etched with $CF_4$ through the apertures formed in the second masking layer. The first masking layer is then etched through the apertures in the second masking layer and silicon nitride layer using reactive ion etching techniques. The etching of the first masking layer continues until the first masking layer is undercut beyond the edges of the aperture in the silicon nitride layer so that the silicon nitride layer forms an overhang of the aperture in the first masking layer. The thin film to be deposited is then applied over the resulting structure including the surface of the silicon nitride layer and the substrate exposed through the apertures. Because of the overhang, a discontinuity is formed between the thin film deposited upon the exposed surface of the substrate and that formed upon the outer surface of the silicon nitride layer so that when the first masking layer is dissolved, the film deposited upon the substrate is left without any edge tearing between it and the removed portions of the film.

15 Claims, 8 Drawing Figures

METHOD OF DEPOSITING THIN FILMS OF SMALL DIMENSIONS UTILIZING SILICON NITRIDE LIFT-OFF MASK

BACKGROUND OF THE INVENTION

This invention relates to a method of depositing thin films, particularly thin films such as metallic films, in the fabrication of integrated circuits.

Present trends in the formation of vacuum deposited thin metallic film commonly use chemical etching in the presence of etch-resistant masking layers to provide the selected pattern. This is the traditional photoengraving or photolithographic etching technique. However, with the continued miniaturization of semiconductor integrated circuits to achieve greater component density and smaller units in large-scale integrated circuitry, the art is rapidly approaching a point where such photolithographic etching of deposited film may be impractical for providing the minute resolution required for the fine line work of metallization in circuitry where film widths of 2 microns or less are desired.

An alternative method for forming such metallization denoted by the term "expendable mask method," "lift-off method" or "stencil method." U.S. Pat. No. 3,873,361, issued Mar. 25, 1975, to Franco et al., entitled "A Method of Depositing Thin Film Utilizing a Lift-Off Mask," and assigned to the present assignee discloses a lift-off method for depositing thin films which avoids the "edge-tearing" problem and is suitable for use where the lateral widths of the spacing between adjacent deposited metallic lines is of the order of 0.05–0.25 mils. The method disclosed in this patent includes the use of an organic polymeric material deposited on the integrated circuit substrate and an overlying layer of an inorganic material, preferably metal, having openings in the selected pattern. Openings are formed in the polymeric material by reactive sputter etching utilizing the metallic mask as a barrier. The openings in the polymeric layer are aligned with and laterally wider than the corresponding openings in the metallic masking layer as a consequence of the reactive sputter etching step. Thus, the edges of the openings in the metallic masking layer overhang the edges of the openings in the underlying polymeric layer. The thin film to be deposited is then applied over the structure and on the surface of the substrate exposed by the openings in the polymeric material. When the polymeric material is removed by application of solvent, the metallic masking layer and the thin film above the masking layer "lift-off" to leave the thin film deposits in the selected pattern on the substrate without "edge tearing" of the desired deposited thin film as the unwanted portions of the thin film are lifted off.

With this process, employing a metallic reactive sputter etching mask, alignment of the etching masks which are used for forming apertures in the masking layers was made difficult as the metal layer was, of course, opaque. The alignment problem could be alleviated by providing two alignment areas at opposite ends of the integrated circuit substrate which are left unmetallized during the metal mask deposition. Unfortunately, the alignment areas are not then available to be used for the production of active surface components, thereby reducing the amount of circuitry which can be provided upon a predetermined wafer area. Also, the use of the evaporated metal reactive sputter etching masking layer requires the use of relatively expensive and time-consuming evaporation steps and the subsequent chemical etching step to pattern the evaporated layer.

To alleviate the problems attendant with the use of such a metallic etching mask, a process was developed in which the metal mask layer was replaced with a transparent layer of polydimethylsiloxane resin which permitted easy optical alignment and eliminated the need for yield-reducing dedicated alignment areas on the surface of the substrate. This method was described in U.S. Pat. No. 4,004,044, issued Jan. 18, 1978, to Franco et al., and assigned to the present assignee. Basically, in this method, the polydimethylsiloxane resin layer which replaced the metal layer was spun-on over the first polymeric masking layer. Otherwise, the method was the same as that described in earlier U.S. Pat. No. 3,873,361, discussed above.

The later-developed technique did in fact make it possible to optically align the exposure masks and eliminated the need for reserved alignment areas, thereby increasing the usable substrate area. Also, the use of such a material proved to be reliable and relatively simple to use in a manufacturing environment. However, it has recently become desirable to provide even finer resolution than is possible with the use of polydimethylsiloxane resin materials.

To produce even finer resolution, such as, for example, metal lands of less than 2 micron widths with 1 micron spacings, the "process bias" requires reduction over that which may be achieved using the polydimethylsiloxane resin material. "Process bias" of the lift-off process described in the patents referenced above is defined as the difference between the dimensions of the developed image (that is, the dimensions of the aperture produced in the upper or second masking layer directly from the photolithographic mask) and the dimensions of the metal film pattern produced at the final step after removal of the masking layers. For minimum process bias, it is desirable that the etch rate of the center layer be much lower than the etch rates for the first and second masking layers of photoresist material for the etchants used in the reactive ion etching steps of the first and second layers, while the etch rate for the center layer should be much higher than the etch rates for the first and second layers for the etchant material used in the reactive ion etching of the center layer. Also, for minimum process bias, it is desirable that the center layer be conformal, that is, the thickness of the center layer should remain the same no matter what the topography of the underlying layer.

Polydimethylsiloxane resin unfortunately has a relatively slow etch rate even with its preferred $CF_4$ plasma etchant. In fact, it is about equal for this etchant material to the etch rate of the imaging resist material. Thus, when the prior art polydimethylsiloxane resin material was etched, the aperture formed in the upper second masking layer was also affected, thereby changing the dimensions of the thin metal film substantially from that which was intended from the dimensions of the original photolithographic mask. Even if the dimensions of the photolithographic mask were decreased to compensate for the relatively slower etch rate of polydimethylsiloxane resin, it was not possible to produce a very precisely dimensioned layer of metal film as its dimensions were then a function of processing variables other than the photolithographic mask dimensions, such as etching time, thickness of the layer of polydimethylsiloxane resin, substrate topography and temperature. Moreover, because polydimethylsiloxane resin must be deposited using a spin-on technique, it was non-conformal and thus subject to being coated on with a thickness which was greatly dependent upon the substrate topography. For example, over a via hole, the thickness of the polydimethylsiloxane layer could be more than twice that in planar regions.

SUMMARY OF THE INVENTION

Accordingly, it is a primary object of the invention to provide an improved tear-free thin film deposition process in which the dimensions of the film are very precisely controllable and in which the width of the film can be made exceedingly small with correspondingly small distances between adjacent areas of deposited film.

It is another object of the present invention to provide such a thin film deposition method in which the various masking layers can be deposited with a uniform thickness and in which the etch rates of the various layers can be precisely controlled.

It is still a further object of the present invention to provide such a thin film deposition method in which the dimensions of the deposited film are determined precisely by a photolithographic mask.

Yet another object of the present invention is to provide such a thin film deposition technique in which the photolithographic mask can be optically aligned without the use of specially provided alignment areas which reduce the amount of available wafer area.

These, as well as other objects of the invention, may be met by a method in which an integrated circuit substrate or wafer is first covered with a first masking layer, preferably of an organic polymeric material such as a photoresist material, which is rendered non-photosensitive. This may be baked on to promote adherence. Upon the first masking layer is then deposited a layer of silicon nitride material. Apertures are formed in the layer of silicon nitride material using standard photolithographic and ion etching techniques. For example, the layer of silicon nitride material may be covered with a second masking layer of photoresist material, the second masking layer of photoresist material exposed through a photolithographic mask and developed to remove the portions of the second layer of masking material which correspond to the desired aperture patterns in the layer of silicon nitride material. The silicon nitride material may be then etched through the apertures in the second masking layers, for example, as by reactive ion etching using carbon tetrafluoride. The silicon nitride layer is preferably deposited using plasma deposition techniques utilizing gaseous sources. Next, conforming openings are made in the first masking layer by a second step of reactive sputter etching in the same sputtering chamber using an oxygen gas ambient instead of a fluorine gas ambient such as carbon tetrafluoride used with the silicon nitride material layer. Overetching of the first masking layer produces an overhang of the silicon nitride layer over the aperture in the first masking layer. The layer of film is then evaporated over the entire exposed surface of the device including the area of the surface of the substrate exposed through the apertures in the silicon nitride material layer and first masking layer. The overhang of the silicon nitride material layer prevents the film deposited upon the substrate from building up in contact with the remaining portion of the deposited film upon the outer surface of the silicon nitride material layer. The underlying first masking layer is then chemically dissolved removing the silicon nitride layer and unwanted portions of the deposited film leaving the film deposited upon the substrate in the preferred pattern. As there is no physical connection between the film deposited upon the substrate and the remaining film, there is no edge-tearing effect produced upon removal of the masking layers and unwanted portions of the film.

DESCRIPTION OF THE PREFERRED EMBODIMENTS

Figure 1A:
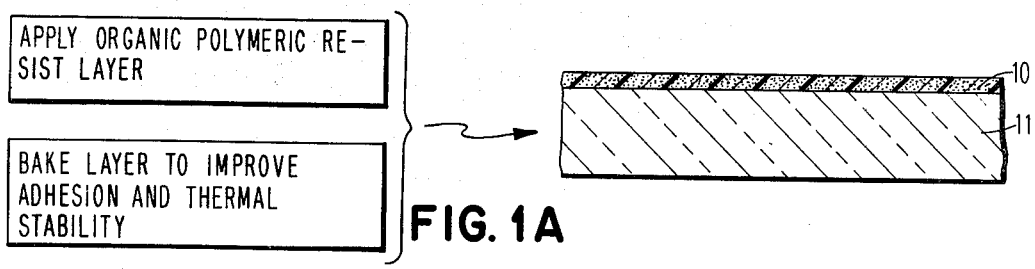
FIGS. 1A-1H are diagrammatic cross-sectional views of an integrated circuit structure at successive steps during the fabrication of a thin film layer in accordance with preferred embodiments of the invention with the various steps accompanied by flow chart descriptions.

FIGS. 1A-1H show an integrated circuit device in various stages of fabrication of a thin film layer of material in accordance with the invention. With reference to FIG. 1A, a first organic polymeric masking layer 10 is formed on substrate 11. Preferably, layer 10 comprises AZ-1350-type polymer which is baked at about 210° C. to improve adhesion to substrate 11. The baking also renders the layer thermally stable and also non-photosensitive so that it will not be affected by photo processing of a second photoresist layer. The thickness of layer 10 determines the maximum thickness of the functional film that can be deposited upon substate 11 without any edge-tearing effect during the subsequent lift-off procedure. In the fabrication of integrated circuits, substrate 11 may be a semiconductor material or a semiconductor substrate having a surface layer of an electrically insulative inorganic material, such as silicon dioxide. Layer 10 may be any polymeric material used in coating which exhibits good adhesion to substrate 11 (as well as to the subsequently applied silicon nitride layer), is thermally stable, and which is removable by reactive sputter etching. The preferred organic polymeric masking material AZ-1350 type comprises a novalac-type phenol-formaldehyde resin and a photosensitive cross-linking agent and is commercially available from the Shipley Corporation. When photoresist material 10 is baked at about 210° C. to improve adhesion to underlying substrate 11, the photoresist is rendered thermally stable as well as non-photosensitive. The loss of photosensitivity is no disadvantage because layer 10 is selectively removed by reactive ion etching. Other suitable photoresist materials include KTFR, available from the Kodak Corporation, synthetic resins, such as polyvinyl cinnamate and polymethyl methacrylate, diazo-type photoresists and polyimides, among others.

Figure 1B:
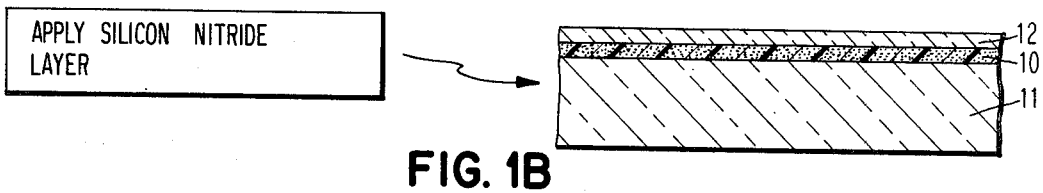

Next, as set forth in FIG. 1B, a layer of silicon nitride material is deposited over the outer surface of layer 10. Preferably, layer of silicon nitride material 12 is deposited using plasma deposition techniques in which a gaseous source is used. Using the preferred technique, the usual evaporation defects, particularly uneven deposition, are eliminated. Moreover, using the gaseous source plasma deposition technique, silicon nitride layer 12 will be conformally coated onto the outer surface of layer 10. That is, the thickness of silicon nitride layer 12 will be constant and substantially independent of the topography of layer 10 and, subsequently, the topography of the substrate and integrated circuit material itself. Also, with this technique, the layer of silicon nitride material 12 will be transparent, permitting optical alignment of the photolithographic mask without the use of alignment tabs. In the preferred embodiment of the method of the invention, a thickness in the range of 1,500–1,600 Angstroms will suffice, although other thickness as well may be used depending upon the precise application involved.

Figure 1C:
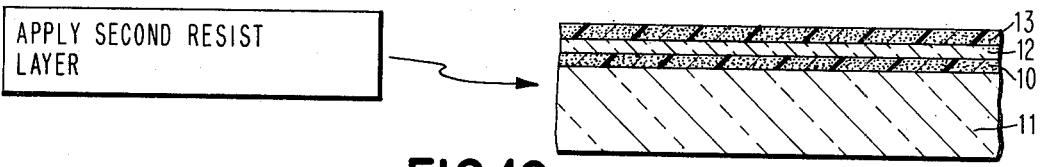
Figure 1D:
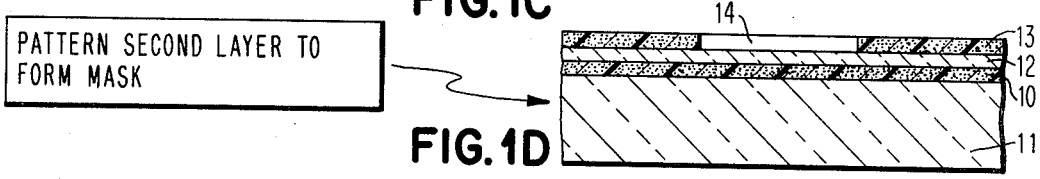

As set forth in FIGS. 1C and 1D, a layer of photo- or electron-beam resist 13 is spun on to silicon nitride layer 12. HMDS (hexamethyldisilazane) or A-1100 silane (available from Union Carbide Corporation) can be used for pretreatment of layer 12 to prepare it for AZ-type photoresist material 13. Openings such as aperture 14 are produced in layer 13 by conventional lithographic techniques such as used in the integrated circuit fabrication art. It is to be noted that silicon nitride layer 12 is transparent, permitting the optical alignment of photolithographic masks applied to the patterned surface of substrate 11. In particular, no alignment tabs are required which would limit the available active device area on substrate 11 as would be the case where layer 12 consisted of an opaque material precluding see-through optical alignment.

Figure 1E:
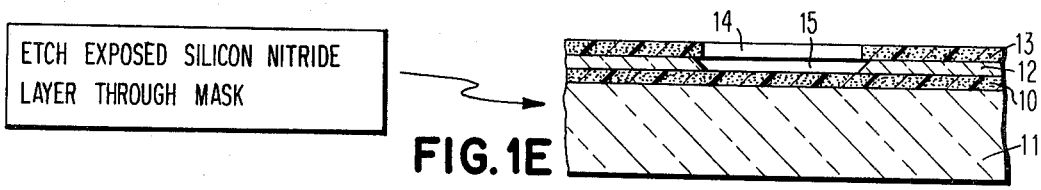

Exposed and patterned layer 13 then is used as a mask for the reactive ion etching of silicon nitride layer 12 as shown in FIG. 1E. The structure of FIG. 1E is placed into an RF sputter etching chamber such as described in U.S. Pat. No. 3,598,710. Silicon nitride layer 12 is etched preferably with DE 100 gas, which is a fluorine-containing gas consisting of $CF_4$ and $O_2$, which is marketed by LFE Corporation. Thus, aperture 14 in layer 13 is effectively transferred into silicon layer 12 as opening 15. Because the etch rate of silicon nitride layer 12 is much higher than that of resist layer 13 with this etchant, the dimensions of aperture 14 are maintained. Resist layer 13 then is removed by a suitable solvent.

Figure 1F:
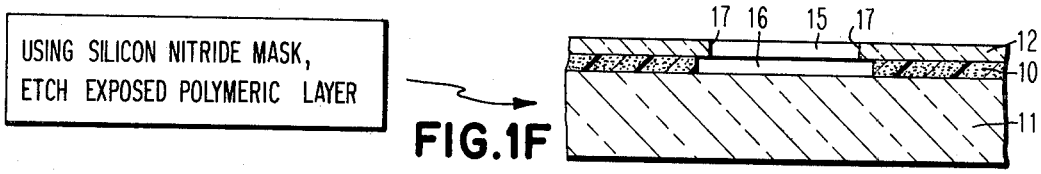

Using silicon nitride layer 12 with aperture 15 as shown in FIG. 1F as a mask, polymeric masking layer 10 is apertured by reactive ion etching in an oxygen gas ambient. The applicable parameters of the oxygen plasma are determined by the desired magnitude of overhang 17 (in aperture 15 in layer 12) with respect to opening 16 sputter etched into polymeric layer 10. For example, a distinct overhang can be achieved at 40 millitorr oxygen pressure, whereas substantially no overhang is produced when etching is done at 4 millitorr oxygen pressure. It is to be noted that as the silicon nitride layer is substantially impervious to oxygen etching, the dimensions of aperture 15 are preserved during this step so that the dimensions of the subsequently deposited thin film layer are accurately determined by the dimensions of aperture 14.

The successive reactive ion sputter etching steps undertaken in accordance with the steps associated with FIGS. 1E and 1F are conveniently accomplished in the same reactive sputter etching chamber utilizing first a fluorine-containing gas atmosphere (in the case of FIG. 1E) followed by a purging and substitution of an oxygen gas ambient (in the case of FIG. 1F).

Overhang 17 in silicon nitride layer 12 permits considerable "over-etching" of polymeric layer 10 to assure that all of the material of layer 10 has been removed in the locations of desired opening 16. The pattern dimensions of the functional thin film material to be deposited on substrate 11 through openings 15 and 16 are determined by the overhang aperture size in layer 12 and not by the greater aperture size in layer 10. As already described, overhang 17 aids in the elimination of edge tearing when the thin film material is lifted off in subsequent steps of the present process.

Figure 1G:

Next, using the lift-off composite structure of FIG. 1F, a functional metallic film 18 is deposited over the structure as shown in FIG. 1G. This metallic film may be any metal conventionally used for integrated circuit metallization, e.g., aluminum, aluminum-copper alloys, platinum, palladium, chromium, etc. Metal film 18 is deposited at a temperature of from room temperature to about 150° C. Alternatively, layer 18 may be an inorganic electrically insulative material, such as silicon dioxide or silicon nitride. Film 18 has a preferred thickness in the order of 15,000–25,000 Angstroms.

Figure 1H:
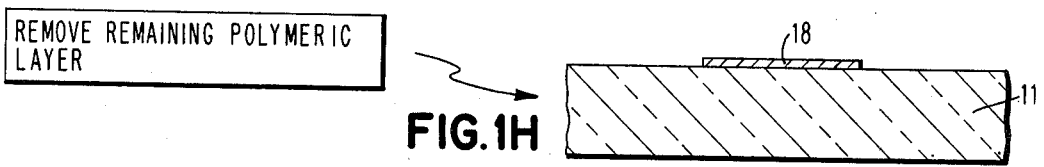

Finally, utilizing conventional lift-off removal techniques, photoresist layer 10 is completely removed by immersion in a solvent, such as N-methyl pyrrolidone standard photoresist solvent, for about 15–30 minutes, which leaves thin film layer 18 in the desired pattern configuration of FIG. 1H. The solvent selected should be one which dissolves or swells the polymeric material of layer 10 without affecting thin film 18. Such solvents include acetone, isopropanol, methyl ethyl ketone or trichloroethylene. The solvents used to dissolve the polymeric material may be the same solvents used in applying polymer coating 10.

For second-level metallurgy, if any is desired, a layer of silicon dioxide (not shown) is placed over the patterned structure of FIG. 1H and the process steps of FIGS. 1A–1H are repeated to provide a patterned second thin film electrically insulated from the underlying first patterned film 18. Silicon nitride layer 12 is resistant to argon ion sputter etching which may be used to clean the first layer metal through via holes formed in the insulating oxide layer.

This completes the description of the preferred embodiments of the invention. Although preferred embodiments have been described, it is believed that numerous modifications and alterations thereto would be apparent to one having ordinary skill in the art without departing from the spirit and scope of the invention.

What is claimed is:

1. A lift-off method for forming a patterned film on a substrate comprising the steps of:
    (a) forming on said substrate a first layer of organic polymeric material;
    (b) forming on said first layer of organic polymeric material a layer of silicon nitride material having selected apertures therein;
    (c) forming, by etching in a second gas ambient, apertures in said first organic polymeric material aligned with said apertures in said layer of silicon nitride material, said apertures in said first layer of organic polymeric material extending beyond the edges of said apertures in said layer of silicon nitride material;
    (d) depositing a film layer onto said substrate through said aperture in said layer of silicon nitride; and
    (e) removing said first layer of organic polymeric material.

2. The method defined in claim 1 wherein said step of forming said layer of silicon nitride material comprises plasma deposition from gaseous sources.

3. The method defined in claim 1 wherein:
    (a) said first gas ambient comprises carbon tetrafluoride; and
    (b) said second gas ambient comprises oxygen.

4. The method defined in claim 1 wherein said film layer comprises a metal.

5. A lift-off method for forming a patterned film on a substrate comprising the steps of:
  (a) forming on said substrate a first layer of organic polymeric material;
  (b) forming on said first layer of organic polymeric material a layer of silicon nitride material;
  (c) forming on said layer of silicon nitride material a second layer of organic polymeric material;
  (d) forming one or more apertures of predetermined dimensions in said second layer of organic polymeric material;
  (e) forming, by etching in a first gas ambient, apertures in said layer of silicon nitride material aligned with said apertures in said second layer of organic polymeric material;
  (f) forming, by etching in a second gas ambient, apertures in said first organic polymeric material aligned with said apertures in said layer of silicon nitride material, said apertures in said first layer of organic polymeric material extending beyond the edges of said apertures in said layer of silicon nitride material;
  (g) depositing a film layer onto said substrate through said aperture in said layer of silicon nitride; and
  (h) removing said first layer of organic polymeric material.

6. The method defined in claim 5 wherein said step of forming said layer of silicon nitride material comprises plasma deposition from gaseous sources.

7. The method defined in claim 5 wherein:
  (a) said first gas ambient comprises carbon tetrafluoride; and
  (b) said second gas ambient comprises oxygen.

8. The method defined in claim 5 wherein said film layer comprises a metal.

9. A lift-off method for forming a patterned film on a substrate comprising the steps of:
  (a) forming on said substrate a first masking layer of organic polymeric material;
  (b) forming on said first layer a transparent layer of silicon nitride material;
  (c) forming on said layer of silicon nitride material a second masking layer having one or more apertures in a desired pattern;
  (d) forming, by reactive sputter etching in a first gas ambient including a fluorine-containing gas, apertures through said layer of silicon nitride material aligned with said apertures in said second masking layer;
  (e) forming, by reactive sputter etching in a second gas ambient including oxygen, apertures through said first masking layer aligned with said apertures in said layer of silicon nitride material, the last-named reactive sputter etching being continued until the edges in said apertures through said silicon nitride material overhang the edges in said apertures through said first masking layer;
  (f) depositing said film onto said substrate through said apertures in said layer of silicon nitride material and said first masking layer; and
  (g) removing said layers.

10. The method defined in claim 9 wherein said reactive sputter etching steps take place successively in the same sputter etching chamber.

11. The method defined in claim 9 wherein said first layer is baked prior to said forming of said layer of resin material.

12. The method defined in claim 9 wherein said second masking layer is a photoresist material.

13. The method defined in claim 9 wherein said second masking layer is an electron-beam resist material.

14. A method for forming a patterned mask on a substrate comprising the steps of:
  (a) forming on said substrate a first masking layer of organic polymeric material;
  (b) forming on said first layer a layer of silicon nitride material;
  (c) forming on said layer of silicon nitride material a second masking layer having one or more apertures in a desired pattern;
  (d) forming, by reactive sputter etching in a first gas ambient including a fluorine-containing gas, apertures through said layer of silicon nitride material aligned with said apertures in said second masking layer; and
  (e) forming, by reactive sputter etching in a second gas ambient including oxygen, apertures through said first masking layer aligned with said apertures in said layer of silicon nitride material.

15. The method defined in claim 14 wherein said reactive sputter etching steps take place successively in the same sputter etching chamber.

* * * * *

UNITED STATES PATENT AND TRADEMARK OFFICE
CERTIFICATE OF CORRECTION

PATENT NO. : 4,202,914
DATED : May 13, 1980
INVENTOR(S) : Janos HAVAS and Gabor PAAL It is certified that error appears in the above-identified patent and that said Letters Patent are hereby corrected as shown below:

IN THE SPECIFICATION:

Column 1, line 50, delete the hyphen in "lift off"

Column 3, line 40, after "photolithographic" delete "and"

and insert -- or --

Column 5, line 11, after "HMDS" insert -- 5 --

Signed and Sealed this

Twenty-eighth Day of October 1980

[SEAL]

Attest:

SIDNEY A. DIAMOND

Attesting Officer

Commissioner of Patents and Trademark